United States Patent
Kimura et al.

(10) Patent No.: US 7,605,621 B2
(45) Date of Patent: Oct. 20, 2009

(54) OSCILLATING APPARATUS

(75) Inventors: Hiroki Kimura, Tokyo (JP); Yuichi Miyaji, Tokyo (JP)

(73) Assignee: Advantest Corporation, Tokyo (JP)

( * ) Notice: Subject to any disclaimer, the term of this patent is extended or adjusted under 35 U.S.C. 154(b) by 15 days.

(21) Appl. No.: 11/776,550

(22) Filed: Jul. 11, 2007

(65) Prior Publication Data
US 2008/0157835 A1    Jul. 3, 2008

Related U.S. Application Data

(63) Continuation of application No. PCT/JP2006/305591, filed on Mar. 20, 2006.

(30) Foreign Application Priority Data
Mar. 23, 2005   (JP)   ............................. 2005-084575

(51) Int. Cl.
*H03L 7/06*   (2006.01)
(52) U.S. Cl. ...................... 327/157; 327/148
(58) Field of Classification Search ........................ None
See application file for complete search history.

(56) References Cited

U.S. PATENT DOCUMENTS 5,404,250 A * 4/1995 Hase et al. ................... 360/51
6,163,184 A * 12/2000 Larsson ...................... 327/156
6,163,187 A * 12/2000 Sano ........................... 327/157
6,229,362 B1 * 5/2001 Choi ........................... 327/157
6,859,108 B2 * 2/2005 Abbasi et al. ................. 331/17
7,459,964 B2 * 12/2008 Dosho et al. ................ 327/554

FOREIGN PATENT DOCUMENTS

| JP | 02-041026 A | 2/1990 |
| JP | 04-081018 A | 3/1992 |
| JP | 04-262618 A | 9/1992 |
| JP | 10-190455 A | 7/1998 |
| JP | 2005-252438 A | 9/2005 |

* cited by examiner

*Primary Examiner*—Cassandra Cox
(74) *Attorney, Agent, or Firm*—Osha • Liang LLP

(57) ABSTRACT

An oscillating apparatus is provided that includes: a filter circuit that includes a capacitor and outputs a control signal based on an amount of charge accumulated in the capacitor; an oscillator that outputs an oscillation signal of a frequency that is based on the control signal; a phase comparator that compares the oscillation signal with a reference signal of a predetermined frequency, to detect a phase difference between the oscillation signal and the reference signal; a switch circuit that controls whether to charge the capacitor according to a predetermined charge current or to discharge the capacitor according to a predetermined discharge current, based on the phase difference; and a current stabilizing current that defines each of the charge current and the discharge current based on a predetermined reference current or a reference voltage.

20 Claims, 12 Drawing Sheets $I_1 = Vref/R1$
$I_2 = Vref/R2$

OSCILLATING APPARATUS

CROSS REFERENCE TO RELATED APPLICATION

This is a continuation application of PCT/JP2006/305591 filed on Mar. 20, 2006 which claims priority from a Japanese Patent Application(s) No. 2005-084575 filed on Mar. 23, 2005, the contents of which are incorporated herein by reference.

BACKGROUND

1. Technical Field

The present invention relates to an oscillating apparatus for generating a signal based on a reference signal. In particular, the present invention relates to an oscillating apparatus for generating a signal with use of a PLL circuit.

2. Description of the Related Art

Normally, PLL (Phase Lock Loop) circuits have been widely used as circuits generating a signal with high accuracy. A PLL circuit compares the frequency of a reference signal and the frequency of an oscillation signal by means of a phase comparator, and changes the frequency of the oscillation signal based on the detected phase difference. It is known, however, that the phase comparator cannot detect a minute phase difference in some cases. The range of such undetected phase difference is referred to as a dead zone.

There has been known a method of using a timing shift current (It) in addition to a charge pump current (Ic) in the PLL circuit, as one method of compensating the existence of such a dead zone. FIG. 11 shows a PLL circuit 60 of a conventional charge pump type. The PLL circuit 60 includes a filter circuit 600, an oscillator 610, a frequency divider 615, a phase comparator 620, a reference signal generator 625, a switch circuit 630, a charge current supply 640, and a charge pump current supply 650.

The filter circuit 600 includes a capacitor 605, and outputs a control signal that is based on the amount of charge accumulated in the capacitor 605. The oscillator 610 outputs an oscillation signal of a frequency that is based on the control signal. The frequency divider 615 either divides or multiplies the frequency of the oscillation signal, and outputs the result to the phase comparator 620. The phase comparator 620 compares the oscillation signal with the reference signal outputted from the reference signal generator 625, and detects the phase difference between the oscillation signal and the reference signal. The switch circuit 630, based on the phase difference, controls whether to charge the capacitor 605 according to a timing shift current (It) outputted from the charge current supply 640, or to discharge the capacitor 605 according to a predetermined discharge current (Ic−It).

Currently, we have not recognized any existence of prior art reference, and so the description thereof is omitted.

FIG. 12 shows an effect that the charge current and the charge pump current give to the phase difference in the PLL circuit 60. The reference signal generator 625 generates a reference signal having a period T. In a certain stationary state, the oscillator 610 is outputting an oscillation signal whose phase difference from the reference signal is t. In such a state, when the oscillation signal has a phase difference with respect to the reference signal, the phase comparator 620 outputs a pulse (signal A) corresponding to the phase difference at the time of rising-up of the signal. Otherwise, the phase comparator 620 outputs a signal B. As a result, charge is accumulated in the capacitor 605 when the signal A is outputted, and charge is discharged from the capacitor 605 when the signal B is outputted.

Here, the oscillation signal is in a stationary state, and that its frequency is not changed. Therefore it means that the amount of charge accumulated in the capacitor 605 is undergoing a transition in the vicinity of a certain standard (X). Accordingly, the amount of charge accumulated by output of the signal A is equal to the amount of charge discharged by output of the signal B. Consequently, the following equation (1) is derived.

$$t(Ic-It)=(T-t)It \qquad \text{equation (1)}$$

By modifying this equation, the following equation (2) is derived.

$$tIc=Tit$$

$$t=T \times It/Ic \qquad \text{equation (2)}$$

Consequently, the phase difference t is determined based on the ratio between the current values of It and Ic.

There are cases where the sizes of these current values fluctuate according to the fluctuation of the temperature both inside and outside the apparatus, or the fluctuation of the power supply voltage. Conventionally, there have been cases where, when the fluctuation ratios of It and Ic are different from each other, the phase difference t also fluctuates due to the fluctuation.

Additionally, as one index of representing the characteristics of a PLL circuit, a loop band is known which is a frequency band of a jitter component followable by the circuit. This loop band is defined by the characteristics of a PLL circuit, e.g. characteristics of the oscillator 610, the size of the charge pump current, etc. Depending on the application of the PLL circuit, this loop band is desired to be variable. For example, suppose a case where, in the oscillator 610, the characteristics representing the frequency of the oscillation signal per voltage value of an applied voltage fluctuates according to the size of the frequency. In such a case and the like, if the loop band can be varied, it becomes possible to prevent the loop band of the PLL from fluctuating attributable to the output frequency.

For changing the loop band of a PLL circuit, there are two possible methods as follows. The first method is to change the gain of the filter circuit by a switch. The second method is to switch the charge pump current value by a switch. According to these methods, however, switches corresponding in number to the minuteness of the variable resolution of the loop band become necessary. In view of this, a multitude of switches become necessary, which would lead to increase in complication of the circuit or increase in power consumption. A method of adjusting the current value of the charge pump current by means of a DA converter can be also considered. However in such a case, the above-mentioned phase difference t may fluctuate by change in the characteristics of the DA converter in response to the effect from the temperature change, and the like.

SUMMARY

In view of this, as one aspect, it is an advantage of the present invention to provide an oscillating apparatus for generating a signal based on a reference signal, which is able to solve the above-mentioned problems. This advantage is achieved by combinations of the features described in the independent claims. The dependent claims further define advantageous concrete examples of the present invention.

According to the first aspect related to the innovations herein, one exemplary oscillating apparatus may include: a filter circuit that includes a capacitor and outputs a control signal based on an amount of charge accumulated in the capacitor; an oscillator that outputs an oscillation signal of a frequency that is based on the control signal; a phase comparator that compares the oscillation signal with a reference signal of a predetermined frequency, to detect a phase difference between the oscillation signal and the reference signal; a switch circuit that controls whether to charge the capacitor according to a predetermined charge current or to discharge the capacitor according to a predetermined discharge current, based on the phase difference; and a current stabilizing current that defines each of the charge current and the discharge current based on a predetermined reference current or a reference voltage.

According to the second aspect related to the innovations herein, one exemplary oscillating apparatus may include: an integration circuit that outputs a control signal based on an integration value of two inputted voltage values; an oscillator that outputs an oscillation signal of a frequency that is based on the control signal; a phase comparator that outputs a phase difference signal of a pulse width that is in accordance with a phase difference between the oscillation signal and the reference signal, by comparing the oscillation signal with a reference signal of a predetermined frequency; a controlling circuit that controls the two inputted voltage values based on the phase difference signal, so as to approximate a phase difference between the oscillation signal and the reference signal to a predetermined reference phase difference; and a voltage stabilizing circuit that defines the two inputted voltage values both based on a predetermined reference voltage.

The summary clause does not necessarily describe all necessary features of the embodiments of the present invention. The present invention may also be a sub-combination of the features described above.

DESCRIPTION OF EXEMPLARY EMBODIMENTS

Some aspects of the invention will now be described based on the embodiments, which do not intend to limit the scope of the present invention, but exemplify the invention. All of the features and the combinations thereof described in the embodiment are not necessarily essential to the invention.

Figure 1:
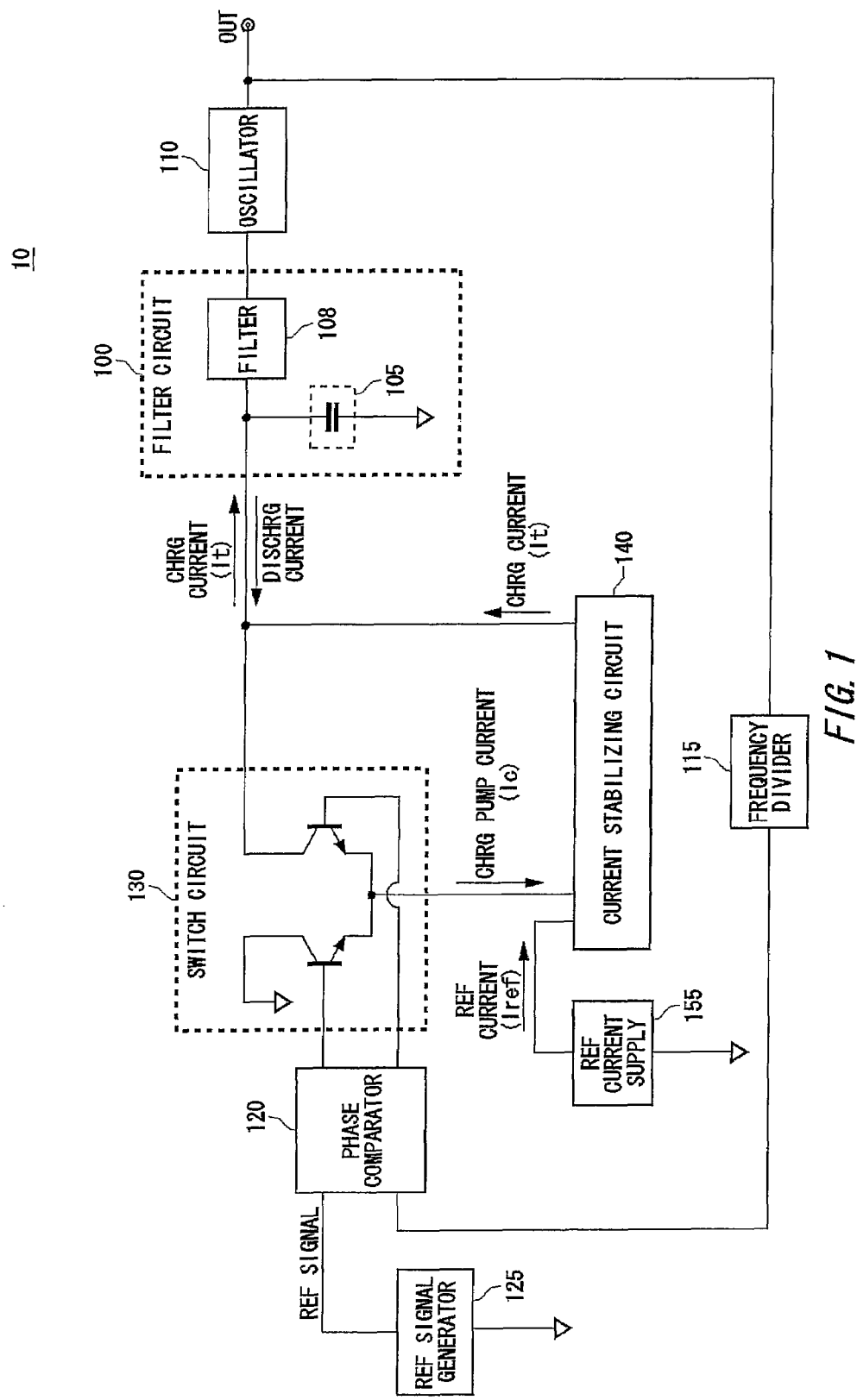
FIG. 1 shows a configuration of an oscillating apparatus 10 according to a first embodiment of the present invention.

FIG. 1 shows a configuration of an oscillating apparatus 10 according to a first embodiment of the present invention. The oscillating apparatus 10 includes a filter circuit 100, an oscillator 110, a frequency divider 115, a phase comparator 120, a reference signal generator 125, a switch circuit 130, a current stabilizing circuit 140, and a reference current supply 155. The filter circuit 100 includes a capacitor 105 and a filter 108, and outputs a control signal that is based on the amount of charge accumulated in the capacitor 105 to the oscillator 110 via the filter 108. The oscillator 110 outputs an oscillation signal of a frequency that is based on the control signal to outside. To be more specific, the frequency of an oscillation signal is defined based on a voltage value of a control signal outputted from the filter circuit 100.

The frequency divider 115 divides or multiplies the frequency of an oscillation signal outputted from the oscillator 110 at a predetermined ratio, and outputs the result to the phase comparator 120. The reference signal generator 125 outputs a reference signal of a predetermined frequency to the phase comparator 120. The phase comparator 120 compares the oscillation signal inputted from the oscillator 110 via the frequency divider 115 and the reference signal inputted from the phase comparator 120, to detect the phase difference between the oscillation signal and the reference signal.

Based on the phase difference detected by the phase comparator 120, the switch circuit 130 controls whether to charge the capacitor 105 according to a predetermined charge current (It) or to discharge the capacitor 105 according to a predetermined discharge current (Ic−It). The current stabilizing circuit 140 defines the charge current and the charge pump current respectively based on a predetermined reference current (Iref). In this way, the charge current and the charge pump current are respectively defined based on the current value of the reference current supply 155. According to this arrangement, the charge current (It) and the discharge current (Ic−It) are prevented from being subjected to different effects from each other even when the temperature or the power supply voltage has fluctuated, thereby stabilizing the phase difference regarding the oscillation signal, and reducing the jitter.

Figure 2:
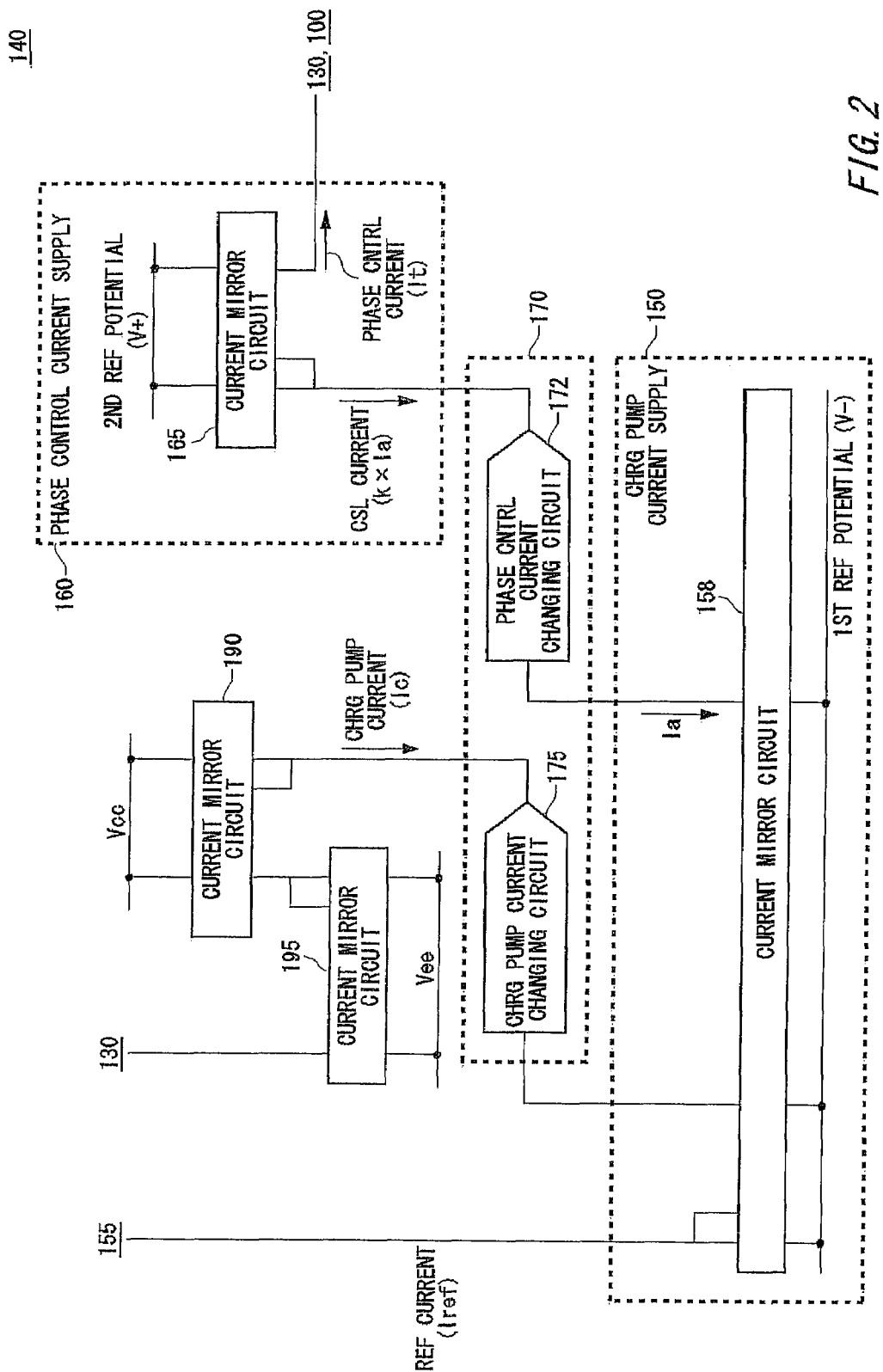
FIG. 2 shows a detailed configuration of the current stabilizing circuit 140 shown in FIG. 1 (First Example).

FIG. 2 shows a detailed configuration of the current stabilizing circuit 140 shown in FIG. 1 (First Example). The current stabilizing circuit 140 includes a charge pump current supply 150, a phase controlling current supply 160, and a current adjusting circuit 170. The charge pump current supply 150 runs a predetermined charge pump current (Ic) of a size corresponding to a summation of the charge current (It) and the discharge current (Ic−It). The charge pump current supply 150, when being connected to the capacitor 105 via the switch circuit 130, discharges the capacitor 105 according to the discharge current (Ic−It). To be more specific, the charge pump current supply 150 has a current mirror circuit 158 connected to the first reference potential (V−), and runs the charge pump current (Ic) and the phase controlling current (Ia) substantially proportional to the reference current (Iref), to the first reference potential (V−) by means of the current mirror circuit 158.

The phase controlling current supply 160 is connected to the capacitor 105, and runs the phase controlling current (It) to the capacitor 105. When the switch circuit 130 has cut off the connection between the capacitor 105 and the current stabilizing circuit 140, the capacitor 105 is charged according to the phase controlling current (It). To be more specific, the phase controlling current supply 160 has a current mirror circuit 165 connected to the second reference potential (V+) that is higher than the first reference potential (V−), and the current mirror circuit 165 runs the phase controlling current (It) that is substantially proportional to the consultation current (K×Ia), from the second reference potential (V+) to the capacitor 105. It should be noted that the current mirror circuit 165 becomes unnecessary when the later-detailed phase controlling current changing circuit 172 is realized by means of a DA converter of a current release type. That is, in that case, the phase controlling current supply 160 may directly supply the current outputted from the phase controlling current changing circuit 172 to the capacitor 105.

The current adjusting circuit 170 includes a phase controlling current changing circuit 172 and a charge pump current changing circuit 175. The phase controlling current changing circuit 172 is for example realized by a DA converter and the like, and changes the size of the phase controlling current by setting the ratio of the consultation current given to the phase controlling current supply 160 with respect to the reference current (Iref) to a designated value. The size of the consultation current resulting from the changing is assumed to be K×Ia. The charge pump current changing circuit 175 is for example realized by a DA converter and the like, and sets the ratio of the charge pump current (Ic) with respect to the reference current (Iref) to a designated value. According to the setting of this ratio, it is possible to set the response characteristic being the change amount of the frequency of the oscillation signal with respect to the fluctuation amount of the phase difference between the reference signal and the oscillation signal. Furthermore, by changing this response characteristic, it becomes possible to arbitrarily define the loop band as a PLL circuit.

To be specific, the charge pump current changing circuit 175 is connected to the switch circuit 130 via the current mirror circuit 190 and the current mirror circuit 195 sequentially. The current mirror circuit 190 is connected to the positive voltage (Vcc) of the circuit power supply, and runs the current substantially proportional to the intake current of the charge pump current changing circuit 175, to the current mirror circuit 195. The current mirror circuit 195 is connected to the negative voltage (Vee) of the current power supply, and runs the charge pump current (Ic) substantially proportional to the current run by the current mirror circuit 190, from the switch circuit 130. Accordingly, it becomes possible to run the current of a predetermined size as the charge pump current, regardless of the characteristics of the DA converter realizing the charge pump current changing circuit 175. It should be noted that, depending on the characteristics of the DA converter, the charge pump current changing circuit 175 may be directly connected to the switch circuit 130.

Furthermore, in changing the ratio of the charge pump current (Ic) with respect to the reference current (Iref), it is preferable that the current adjusting circuit 170 changes the phase controlling current (It) too, so as to maintain the ratio between the charge pump current (Ic) and the phase controlling current (It) as it is before the change. According to this, it becomes possible to change only the response characteristic, by maintaining the phase difference of the oscillation signal with respect to the reference signal constant.

Moreover, it is further preferable that, when the time elapsed after the oscillating apparatus 10 has started outputting an oscillation signal is shorter, the current adjusting circuit 170 sets the response speed for changing the frequency in response to the fluctuation of the phase difference, to be faster than when the elapsed time is longer. According to this, when the phase difference between the oscillation signal and the reference signal is large at the time of power supply throwing and the like, it is possible to match the frequency to the reference signal swiftly as well as making it harder to be subjected to the effect of a minute fluctuation of the frequency of the reference signal when the frequency has been stabilized thereafter.

Figure 3:
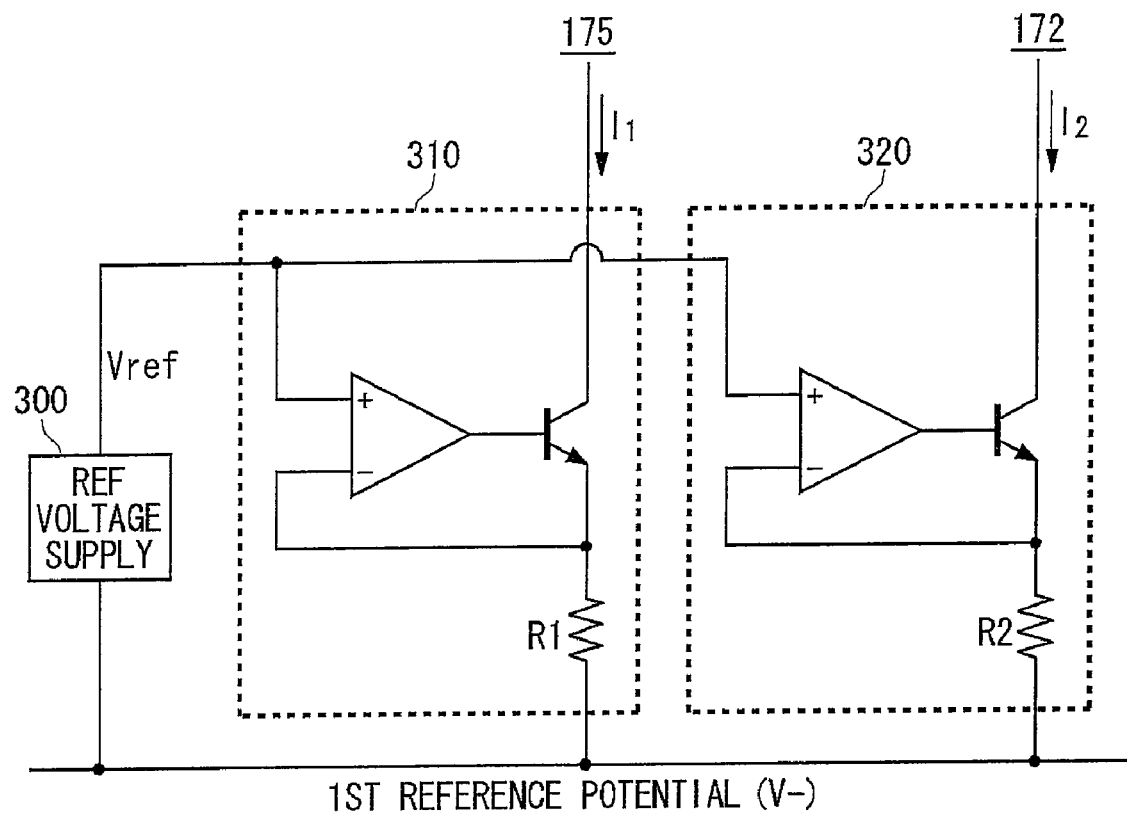
FIG. 3 shows a modification example of the charge pump current supply 150 shown in FIG. 2.

FIG. 3 shows a modification example of the charge pump current supply 150 shown in FIG. 2. In this modification example, the charge pump current supply 150 includes a reference voltage supply 300, a charge pump current generating circuit 310, and a phase controlling current generating circuit 320. The reference voltage supply 300 is connected to the first reference potential (V−), and defines the potential of which the potential difference from the first reference potential is set as the reference voltage value (Vref). The charge pump current generating circuit 310 runs the current ($I_1$) that is proportional to the size of the reference voltage value (Vref), to the first reference potential. The current ($I_1$) corresponds to a value obtained by dividing the reference voltage value (Vref) by a reference resistance value (R1). In addition, the phase controlling current generating circuit 320 runs the phase controlling current ($I_2$) proportional to the size of the reference voltage value (Vref), to the first reference potential. The phase controlling current ($I_2$) corresponds to a value obtained by dividing the reference voltage value (Vref) by a reference resistance value (R2).

In this way, a common reference for determining the charge current and the discharge current may also be the reference voltage not only the reference current. According to such a configuration too, it becomes possible to equalize the effect undergone by the charge current and the discharge current such as a temperature fluctuation and the like. Therefore, it becomes possible to maintain the phase difference of the oscillation signal with respect to the reference signal constant.

Figure 4:
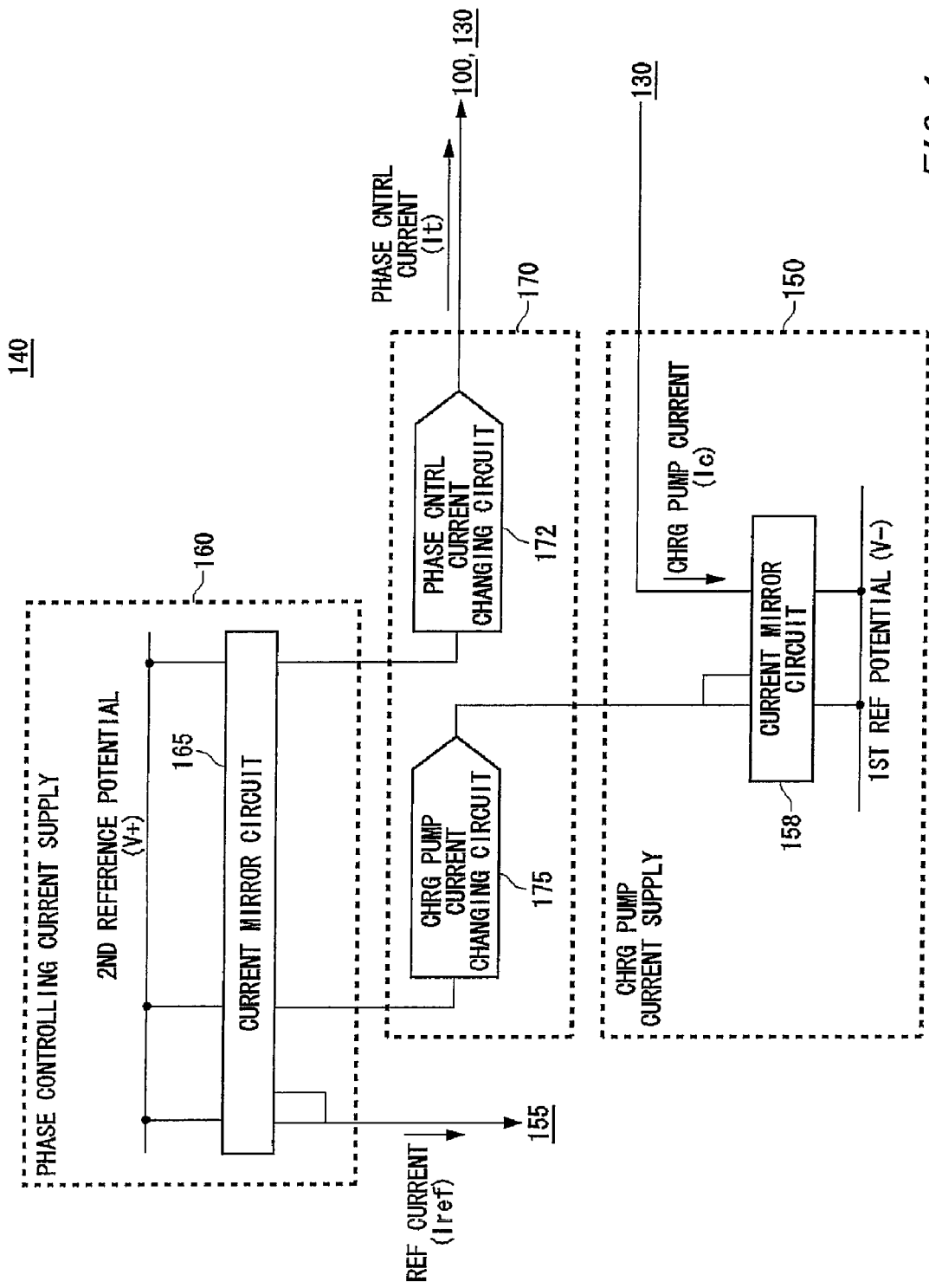
FIG. 4 shows a detailed configuration of the current stabilizing circuit 140 shown in FIG. 1 (Second Example).

FIG. 4 shows a detailed configuration of the current stabilizing circuit 140 shown in FIG. 1 (Second Example). As in the same way as in FIG. 2, the current stabilizing circuit 140 includes a charge pump current supply 150, a phase controlling current supply 160, and a current adjusting circuit 170. In the example of this diagram, however, the charge pump current supply 150 is connected to the first reference potential (V−), unlike in FIG. 2. The charge pump current supply 150 runs a charge pump current substantially proportional to a predetermined consultation current, from the switch circuit 130 to the first reference potential. For running the substantially proportional current, it is possible to use a current mirror circuit 158, for example.

The phase controlling current supply 160 is connected to the second reference potential that is higher than the first reference potential (V−), unlike in the example of FIG. 2. The phase controlling current supply 160 runs a consultation current and a phase controlling current substantially proportional to a reference current, from the second reference potential (V+) to the charge pump current supply 150 and the capacitor 105. For running the substantially proportional current, it is possible to use a current mirror circuit 165, for example.

The current adjusting circuit 170 includes a phase controlling current changing circuit 172 and a charge pump current changing circuit 175, as in the same way as in FIG. 2. The phase controlling current changing circuit 172 is for example realized by a DA converter and the like, and sets the ratio of the phase controlling current with respect to the reference current (Iref), to a designated value. The charge pump current changing circuit 175 is for example realized by a DA converter and the like, and changes the ratio of the charge pump current (Ic) with respect to the reference current (Iref), to a designated value. According to the setting of this ratio, it is possible to set the response characteristic being the change amount of the frequency of the oscillation signal with respect to the fluctuation amount of the phase difference between the reference signal and the oscillation signal. Furthermore, by changing this response characteristic, it becomes possible to arbitrarily define the loop band as a PLL circuit.

Figure 5:
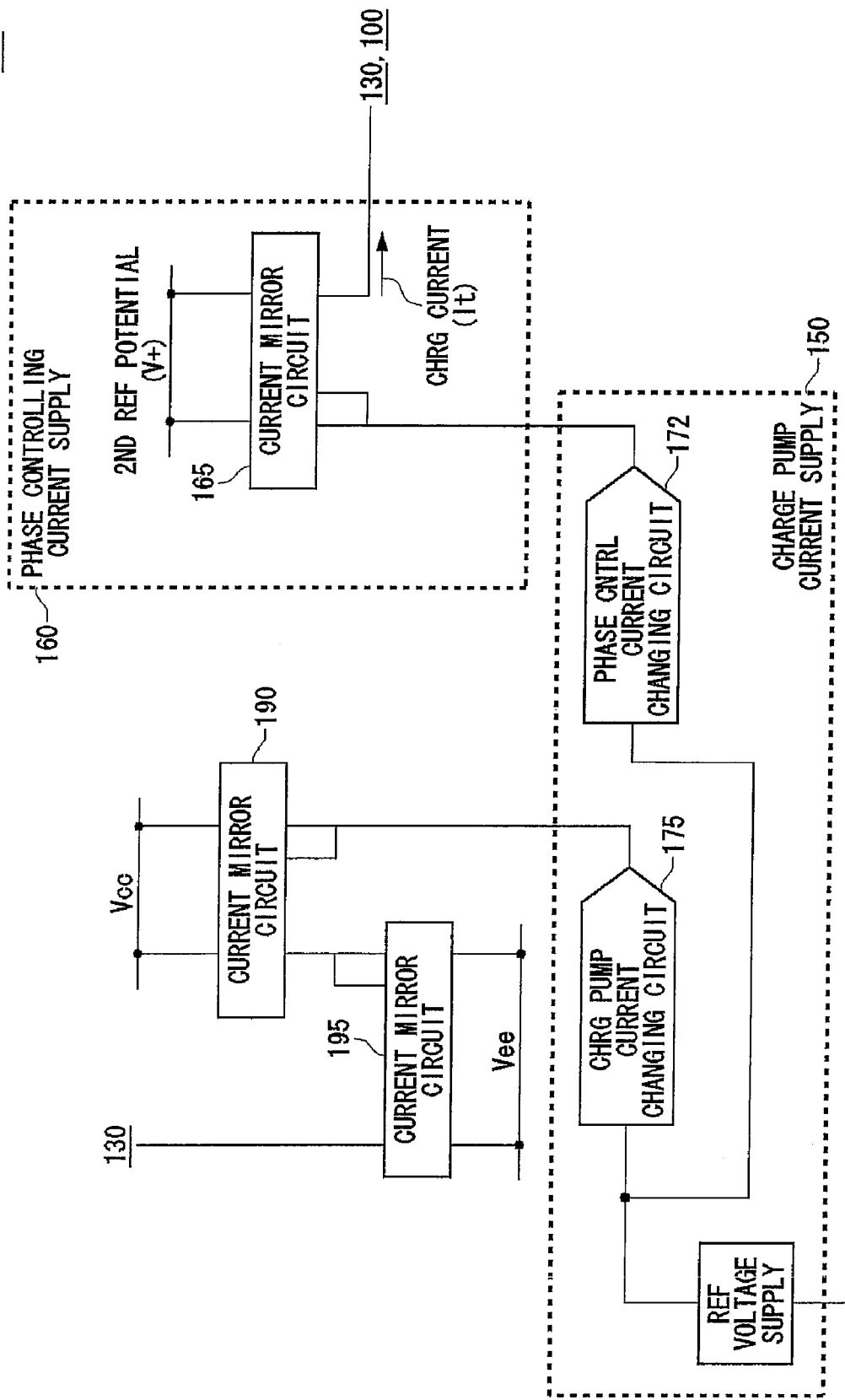
FIG. 5 shows a detailed configuration of the current stabilizing circuit 140 shown in FIG. 1 (Third Example).

FIG. 5 shows a detailed configuration of the current stabilizing circuit 140 shown in FIG. 1 (Third Example). In this example, as in the same way as the current adjusting circuit 170 shown in FIG. 2, the charge pump current supply 150 includes a phase controlling current changing circuit 172 and a charge pump current changing circuit 175. However, different from FIG. 2, both of the phase controlling current changing circuit 172 and the charge pump current changing circuit 175 input a predetermined reference voltage. The phase controlling current changing circuit 172 sets the ratio of the phase controlling current with respect to the reference voltage to a designated value, and outputs the ratio to the phase controlling current supply 160. The charge pump current changing circuit 175 changes the response characteristic of the oscillation signal by setting the ratio of the charge pump current with respect to the reference voltage to a designated value. The other configurations are substantially the same as those of the current stabilizing circuit 140 shown in FIG. 2, and so the description thereof is omitted in the following.

As in the above, according to the present example too, it is possible to define the current values of the charge pump current and of the charge current based on a common reference voltage. Accordingly, it becomes possible to equalize the effect undergone by the charge current and the discharge current such as a temperature fluctuation and the like. Therefore, it becomes possible to maintain the phase difference of the oscillation signal with respect to the reference signal constant.

Figure 6:
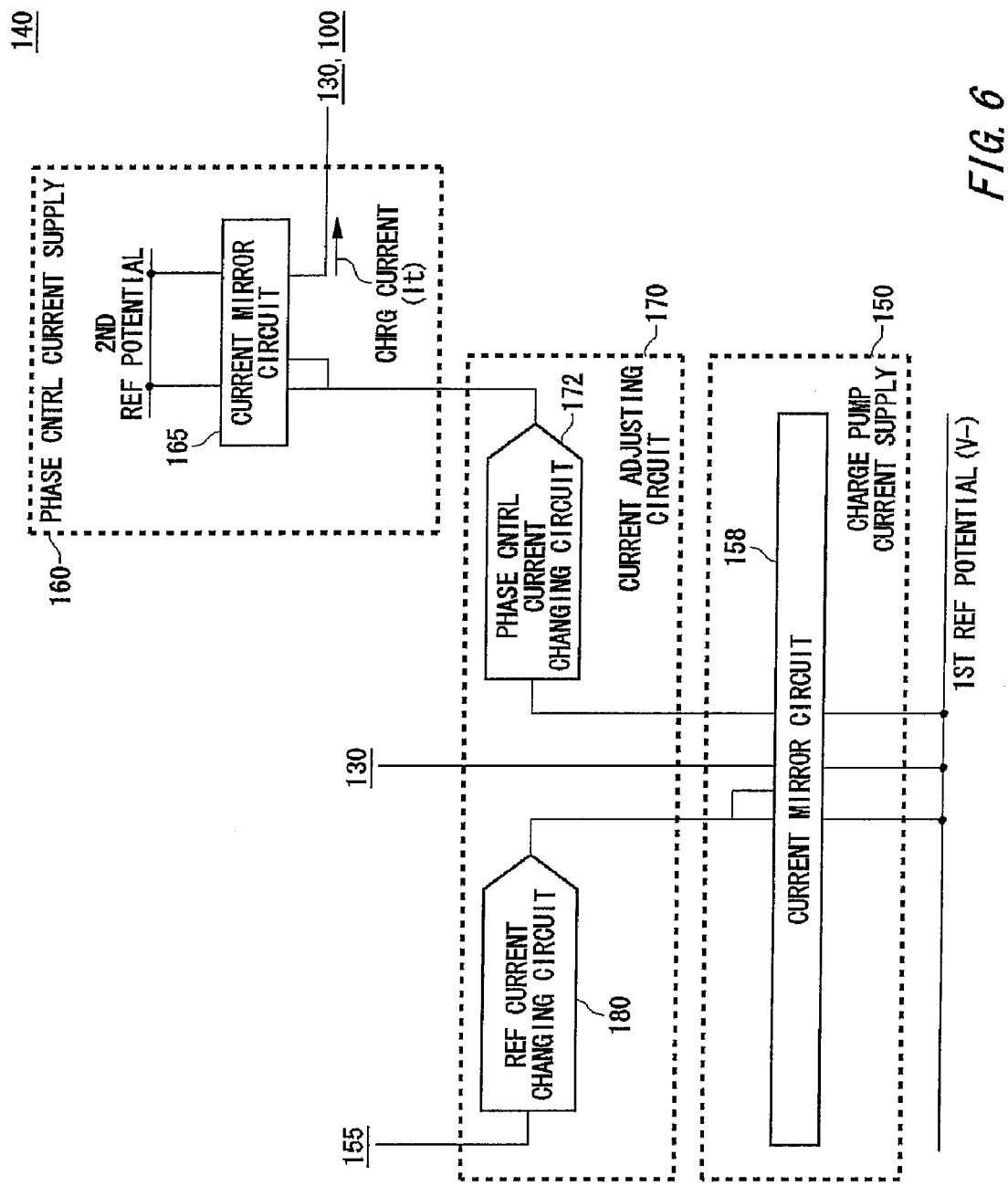
FIG. 6 shows a detailed configuration of the current stabilizing circuit 140 shown in FIG. 1 (Fourth Example).

FIG. 6 shows a detailed configuration of the current stabilizing circuit 140 shown in FIG. 1 (Fourth Example). In the present example, as the configuration shown in FIG. 2, the current stabilizing circuit 140 includes a charge pump current supply 150, a phase controlling current supply 160, and a current adjusting circuit 170. Note here that different from FIG. 2, the current adjusting circuit 170 includes a reference current changing circuit 180 instead of a charge pump current changing circuit 175. The reference current changing circuit 180 is for example realized by a DA converter and the like, and sets the current value of the reference current to a designated value. The charge pump current supply 150 runs a charge pump current substantially proportional to the reference current, and runs a phase controlling current substantially proportional to the reference current.

As a result, by changing the current value of a reference current, it becomes possible to change only the response characteristic being the change amount of the frequency of the oscillation signal with respect to the fluctuation amount of the phase difference, while maintaining the ratio between the charge pump current and the charge current constant. In addition, just as in the same way as in FIG. 2, it is possible to change the ratio between the charge pump current and the charge current by means of the phase controlling current changing circuit 172. Therefore, it is also possible to arbitrarily set the phase difference of the oscillation signal with respect to the reference signal.

Figure 7:
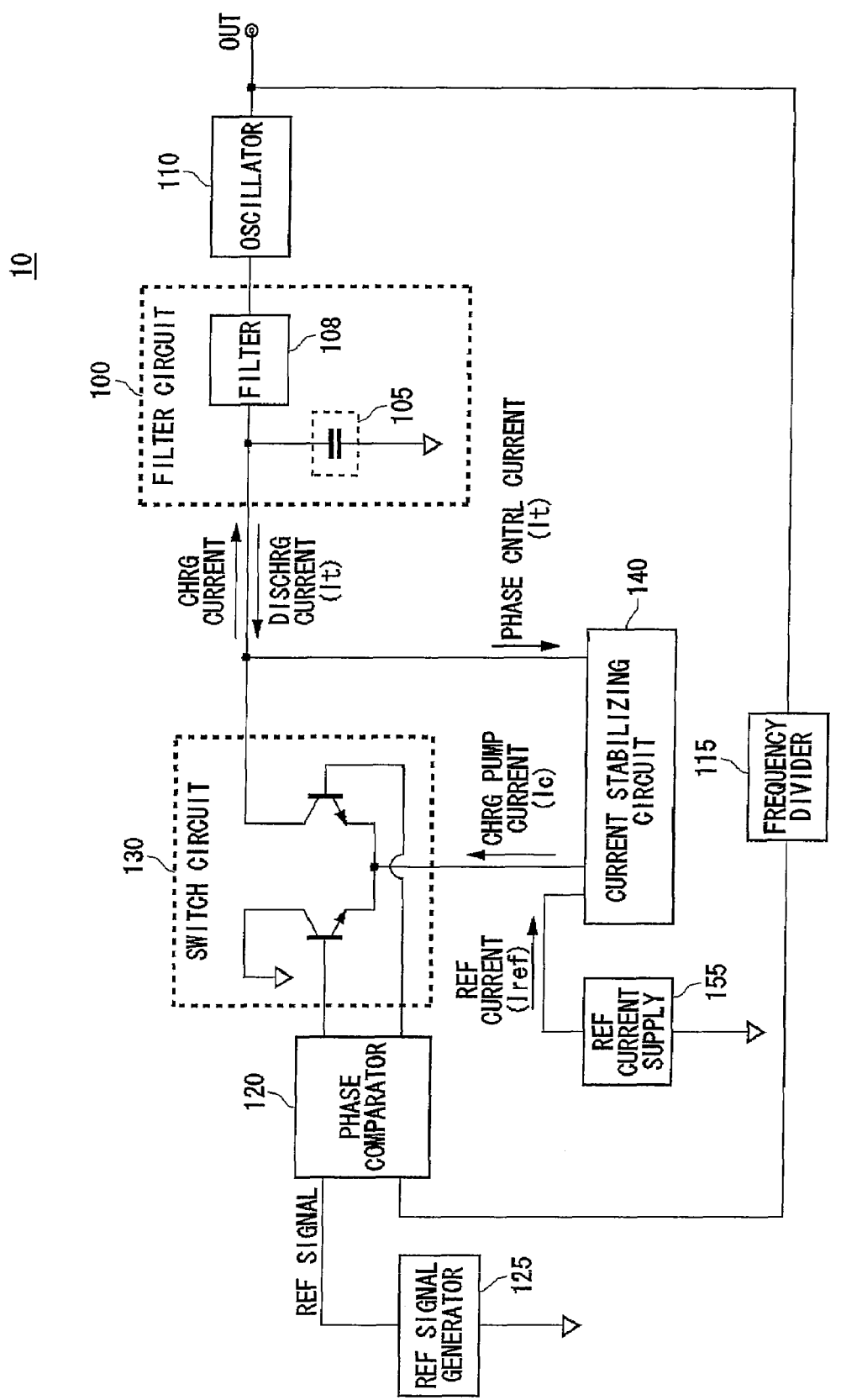
FIG. 7 shows a configuration of an oscillating apparatus 10 according to a second embodiment of the present invention.

FIG. 7 shows a configuration of an oscillating apparatus 10 according to a second embodiment of the present invention. As in the same way as in FIG. 1, the oscillating apparatus 10 includes a filter circuit 100, an oscillator 110, a frequency divider 115, a phase comparator 120, a reference signal generator 125, a switch circuit 130, a current stabilizing circuit 140, and a reference current supply 155. As follows, the differences from FIG. 1 are described. The switch circuit 130 controls whether to discharge the capacitor 105 according to a predetermined discharge current (It) or to charge the capacitor 105 according to a predetermined charge current (Ic–It), based on the phase difference detected by the phase comparator 120. The current stabilizing circuit 140 defines the charge pump current (Ic) and the phase controlling current (It) both based on the reference current (Iref). Consequently, each of the charge current and the discharge current is defined based on the reference current (Iref). According to this arrangement, the charge current and the discharge current are prevented from being subjected to different effects from each other even when the temperature or the power supply voltage has fluctuated, thereby stabilizing the phase difference regarding the oscillation signal, and reducing the jitter.

Figure 8:
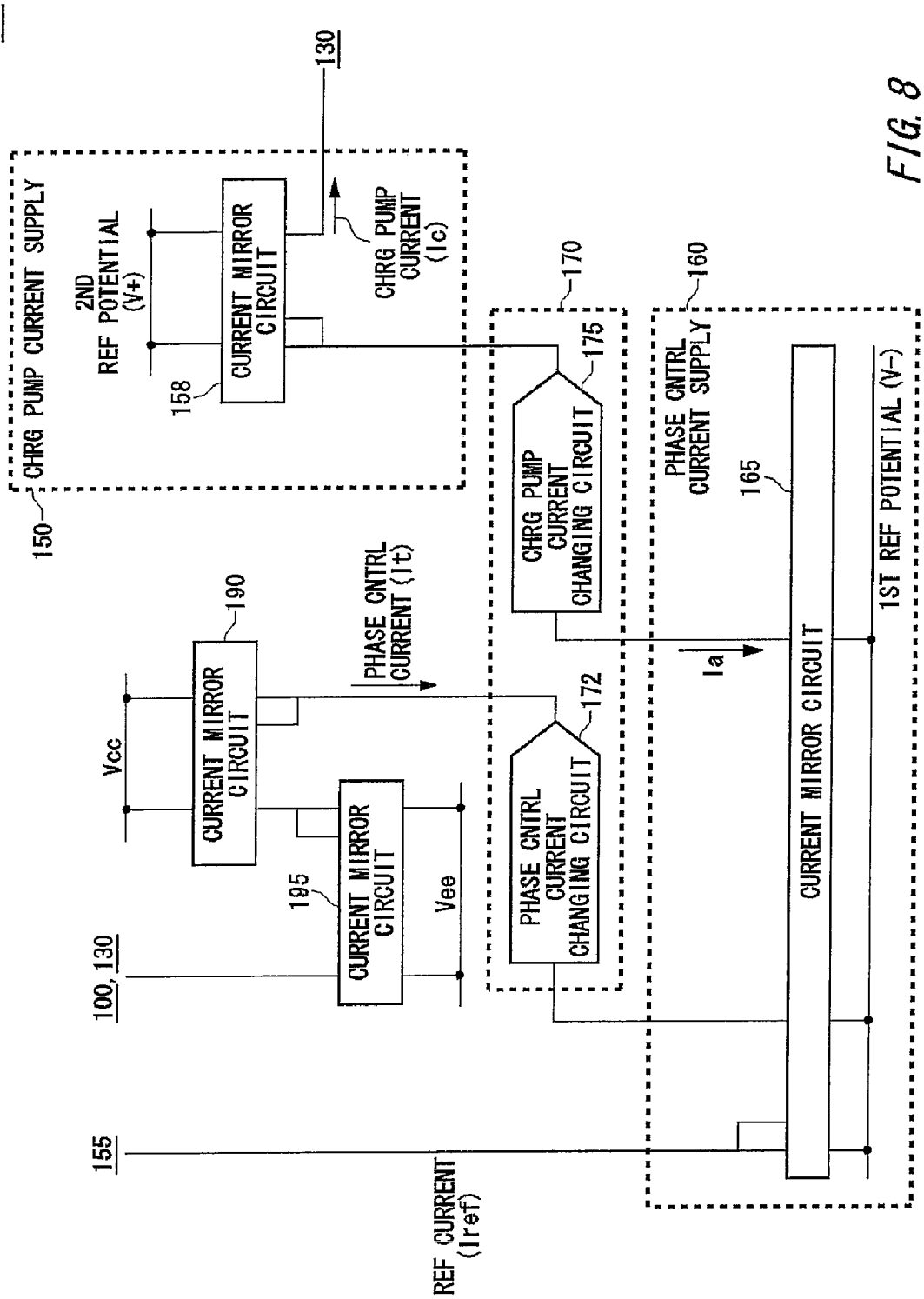
FIG. 8 shows a detailed configuration of the current stabilizing circuit 140 shown in FIG. 7.

FIG. 8 shows a detailed configuration of the current stabilizing circuit 140 shown in FIG. 7. As in the same way as in FIG. 2, the current stabilizing circuit 140 includes a charge pump current supply 150, a phase controlling current supply 160, and a current adjusting circuit 170. As follows, the differences from FIG. 2 are described. The charge pump current supply 150 runs a predetermined charge pump (Ic), and when being connected to the capacitor 105 via the switch circuit 130, the charge pump current supply 150 charges the capacitor 105. Concretely, the charge pump current supply 150 has a current mirror circuit 158 connected to the second reference potential (V+), and runs the charge pump current (Ic) that is substantially proportional to the consultation current, to the switch circuit 130 by means of the current mirror circuit 158.

The phase controlling current supply 160 is connected to the capacitor 105, and sets a predetermined phase controlling current as a discharge current, and discharges the capacitor 105 according to the discharge current. Concretely, the phase controlling current supply 160 has a current mirror circuit 165 connected to the first reference potential (V–) that is lower than the second reference potential (V+), and the current mirror circuit 165 runs a consultation current (Ia) and a phase controlling current (It) substantially proportional to the reference current (Iref).

The current adjusting circuit 170 includes a phase controlling current changing circuit 172 and a charge pump current changing circuit 175. The phase controlling current changing circuit 172 is for example realized by a DA converter and the like, and changes the size of the phase controlling current by setting the ratio of the phase controlling current with respect to the reference current (Iref) to a designated value. The charge pump current changing circuit 175 is for example realized by a DA converter and the like, and sets the ratio of the charge pump current (Ic) with respect to the consultation current (Ia) to a designated value. According to the setting of this ratio, it is possible to set the response characteristic being the change amount of the frequency of the oscillation signal with respect to the fluctuation amount of the phase difference between the reference signal and the oscillation signal.

Figure 9:
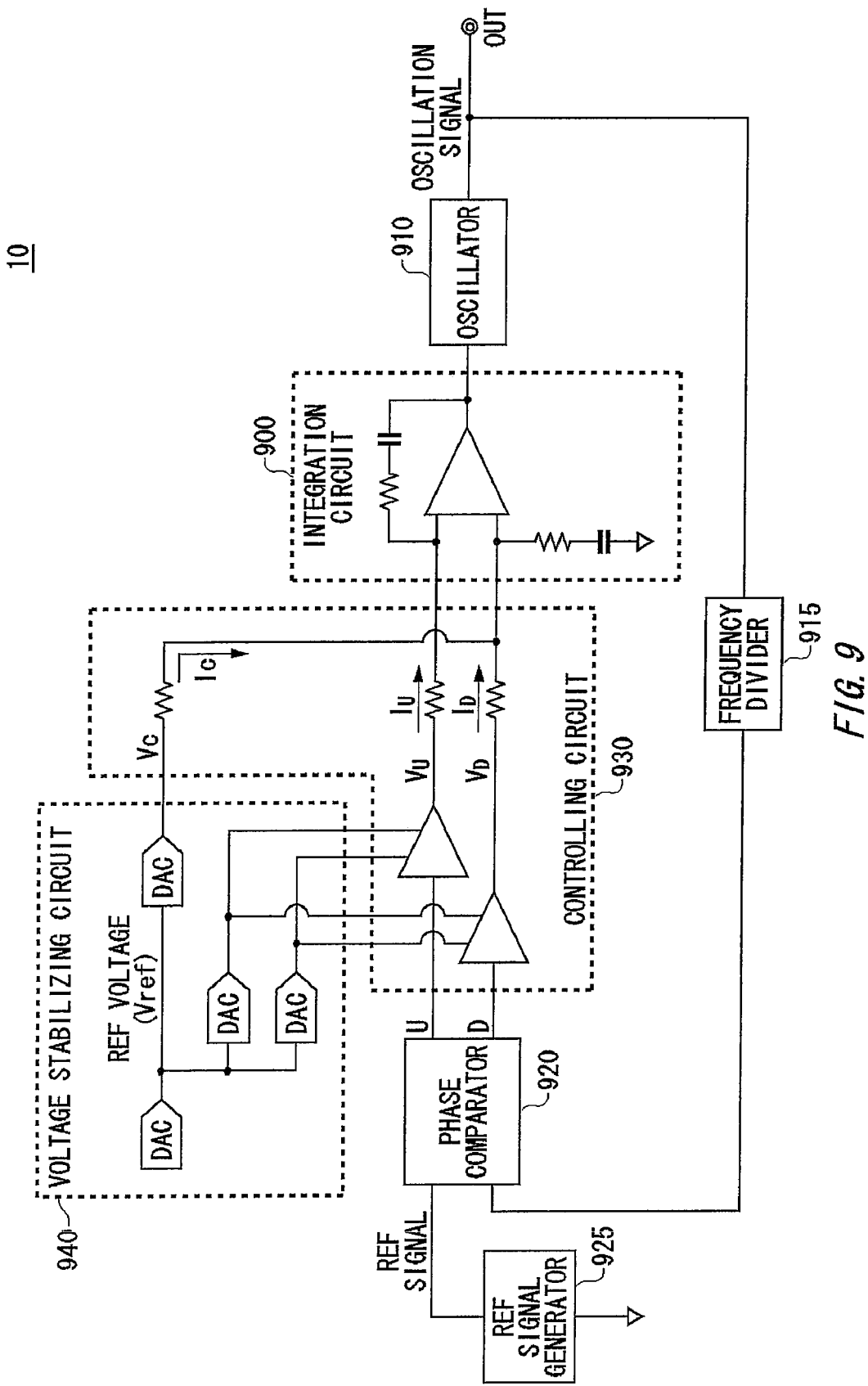
FIG. 9 shows a configuration of an oscillating apparatus 10 according to a third embodiment of the present invention.
Figure 10:
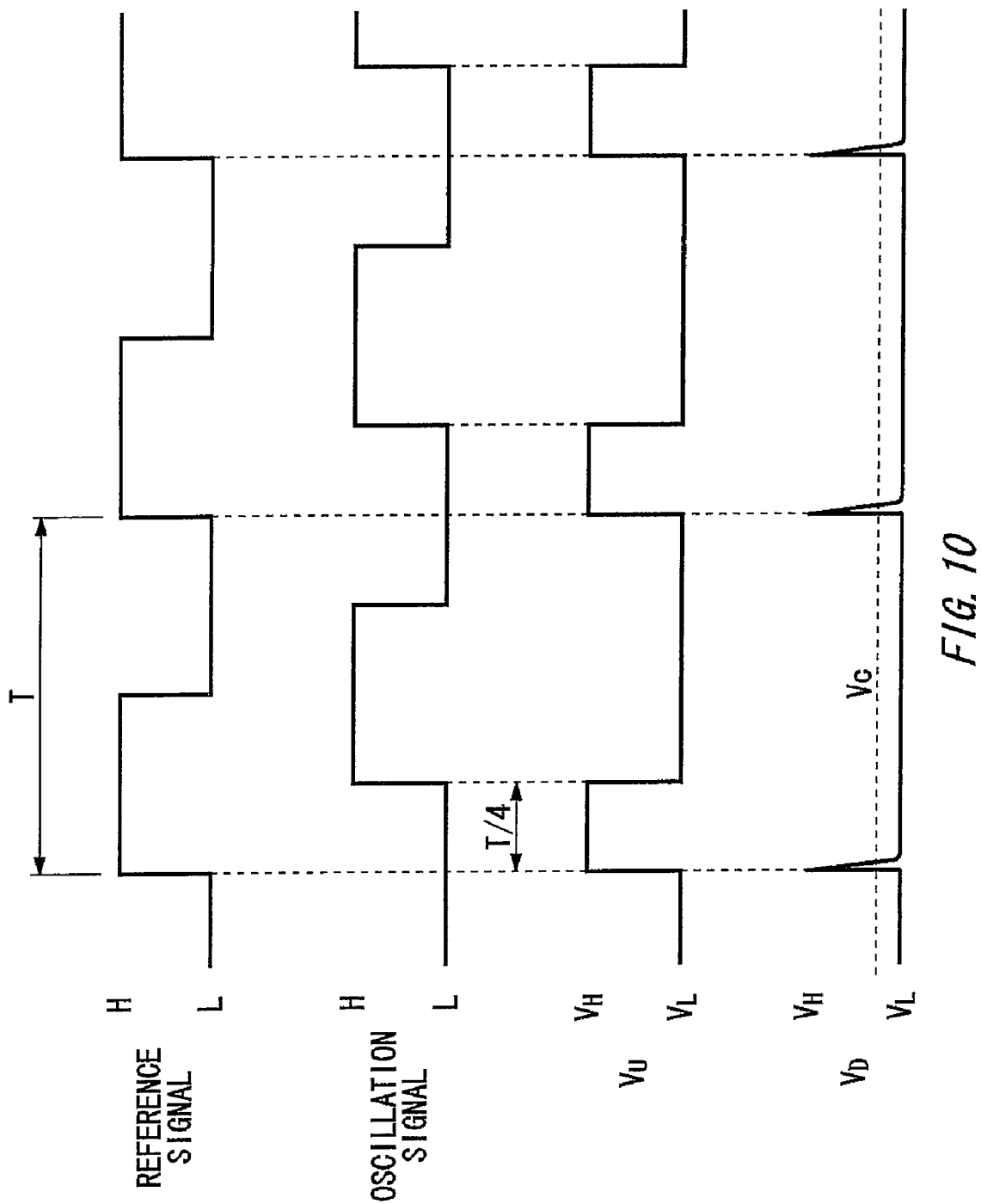
FIG. 10 shows a waveform of each control signal, in the oscillating apparatus 10 shown in FIG. 9.
Figure 11:
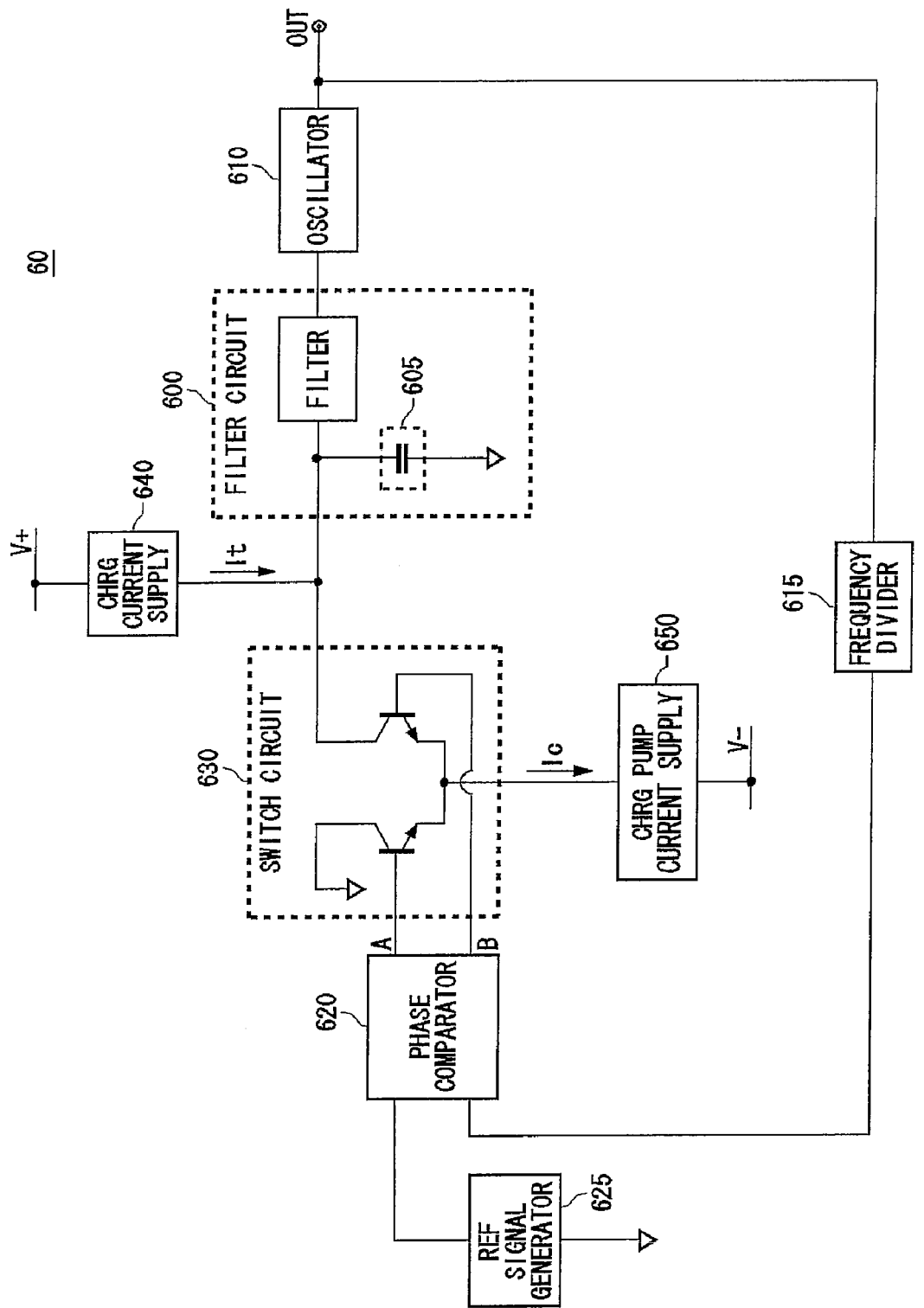
FIG. 11 shows a PLL circuit 60 of a conventional charge pump type.
Figure 12:
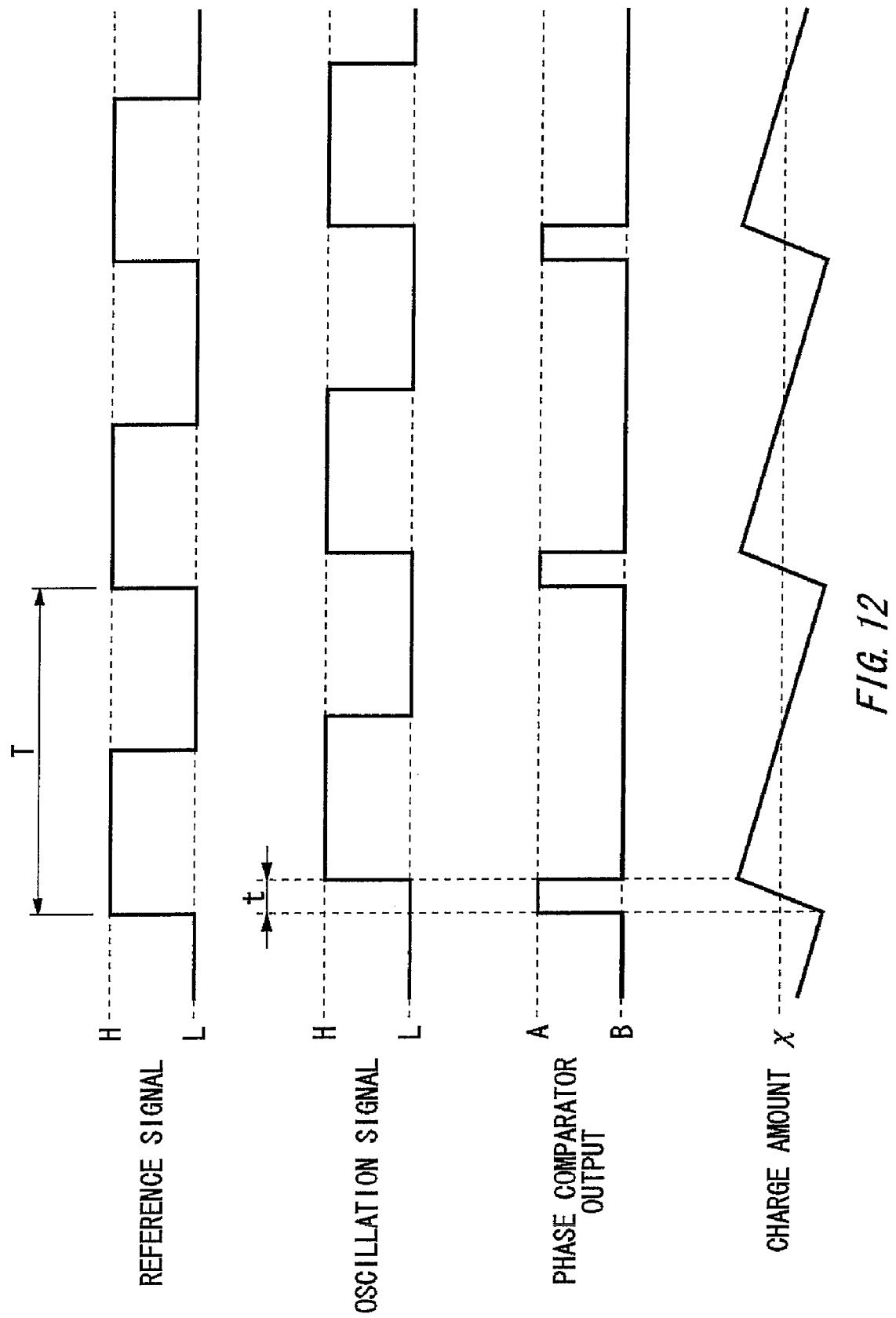
FIG. 12 shows an effect that the charge current and the charge pump current give to the phase difference in the PLL circuit 60.

FIG. 9 shows a configuration of an oscillating apparatus 10 according to a third embodiment of the present invention. FIG. 10 shows a waveform of each control signal, in the oscillating apparatus 10 shown in FIG. 9. The oscillating apparatus 10 includes an integration circuit 900, an oscillator 910, a frequency divider 915, a phase comparator 920, a reference signal generator 925, a controlling circuit 930, and a voltage stabilizing circuit 940. The oscillator 910, the frequency divider 915, and the reference signal generator 925 are substantially the same as the oscillator 110, the frequency divider 115, and the reference signal generator 125 explained with reference to FIG. 1, and so the description thereof is omitted in the following. The integration circuit 900 outputs a control signal based on an integration value of two inputted voltage values. As one example, the integration circuit 900 is realized by a circuit that feeds back an output of the comparator to the input side.

The phase comparator 920 compares an oscillation signal with a reference signal of a predetermined frequency. The phase comparator 920 outputs a phase difference signal having a pulse width that is in accordance with the phase difference between the oscillation signal and the reference signal. For example, when the phase of the oscillation signal is delayed with respect to the reference signal, the phase comparator 920 outputs a signal having a pulse width that is in accordance with the delay, to a terminal U at the time of rising-up of the reference signal (See $V_U$ in FIG. 10). In this case, the phase comparator 902 does not output a signal to the terminal D. However, depending on the specification of the circuit device realizing the phase comparator 920, there are cases where an extremely small pulse occurs at the time of rising-up of the reference signal.

The controlling circuit 930 controls the two inputted voltage values based on a phase difference signal, so as to approximate the phase difference between the oscillation signal and the reference signal to a predetermined reference phase difference. To be more specific, the controlling circuit 930 generates a voltage ($V_U$) and a voltage($V_D$), ased on voltage values respectively of the terminal U and the terminal D of the phase comparator 920. Furthermore, the controlling circuit 930 generates a predetermined phase controlling voltage (Vc). Then the controlling circuit 930 sets the phase controlling voltage (Vc) and the voltage ($V_D$) as one inputted voltage value with respect to the integration circuit 900, and the voltage ($V_U$) as the other inputted voltage value. The voltage stabilizing circuit 940 defines the two inputted voltage values both based on a predetermined reference voltage (Vref).

Here, when the frequency of the oscillation signal makes a stable transition, current values of the two currents inputted to the integration circuit 900 are equalized, since the voltage of a control signal inputted to the oscillator 910 is stabilized. That is, the relationship among the current (Ic) generated by the phase controlling voltage (Vc), the current ($I_U$) generated by the voltage ($V_U$), and the current ($I_D$) generated by the voltage ($V_D$) is Ic+$I_D$=$I_U$. In this case, $V_U$=Vc+$V_D$. Now suppose that the voltage (Vc) is expressed as Vc=V1+(Vh−V1), by using one level voltage (Vh) and the other level voltage (V1) of the voltage ($V_U$).

In this case, the controlling circuit 930 controls so that the voltage value inputted to the integration circuit 900 is equalized, by delaying the oscillation signal with respect to the reference signal by ¼ period. In this way, according to the present embodiment, by appropriately defining the size of the phase controlling voltage, it becomes possible to define the reference potential difference of the oscillation signal with respect to the reference signal. Moreover, the phase comparator 920 and the controlling circuit 930 are able to control the phase difference of the oscillation signal with respect to the reference signal, to be approximated to this reference potential difference.

In addition, the loop band in the present embodiment is defined based on each element of the sensitivity of the oscillator 910, the gain of the loop filter, and the amplitude of the inputted voltage value to the integration circuit 900. For example, the reference voltage (Vref) shown in FIG. 9 may be changed so as to change the amplitude of the inputted voltage value. In this way, according to the present embodiment, too, it is possible to arbitrarily define the loop band, just as in the other embodiments described above.

It should be noted that the circuitry configuration shown in FIG. 9 is only an example, and various types of modification examples are considered. For example, the phase controlling voltage (Vc) may be applied to any input terminal of the integration circuit 900. In addition, the integration circuit 900 may set a predetermined constant voltage value defined based on the reference voltage (Vref) as an input, instead of the inputted voltage value ($V_U$). In this case, too, the phase comparator 920 and the controlling circuit 930 are able to define the phase difference of the oscillation signal with respect to the reference signal, to a predetermined phase difference.

Although some aspects of the present invention have been described by way of exemplary embodiments, it should be understood that those skilled in the art might make many changes and substitutions without departing from the spirit and the scope of the present invention which is defined only by the appended claims.

As clear from the above explanation, according to one embodiment of the present invention, it is possible to realize an oscillating apparatus that is able to stabilize a phase difference of an oscillation signal with respect to a reference signal in a PLL circuit, and to provide the phase difference and the loop band that are changeable.

What is claimed is:

1. An oscillating apparatus comprising:
   a filter circuit that includes a capacitor and outputs a control signal based on an amount of charge accumulated in the capacitor;
   an oscillator that outputs an oscillation signal of a frequency that is based on the control signal;
   a phase comparator that compares the oscillation signal with a reference signal of a predetermined frequency, to detect a phase difference between the oscillation signal and the reference signal;
   a switch circuit that controls whether to charge the capacitor according to a predetermined charge current or to discharge the capacitor according to a predetermined discharge current, based on the phase difference; and
   a current stabilizing circuit that defines each of the charge current and the discharge current based on a predetermined reference current or a reference voltage, the current stabilizing circuit including:
      a phase controlling current supply that is connected to the capacitor, and supplies a predetermined phase controlling current to the capacitor as the charge current; and
      a charge pump current supply that runs a predetermined charge pump current, and when being connected to the capacitor via the switch circuit, discharges the capacitor,
   wherein current values respectively of the phase controlling current and of the charge pump current are set to be substantially proportional to the reference current or the reference voltage.

2. The oscillating apparatus as set forth in claim 1, wherein the charge pump current supply is connected to a first reference potential, and runs the charge pump current and a consultation current substantially proportional to the reference current, to the first reference potential, and the phase controlling current supply is connected to a second reference potential higher than the first reference potential, and runs the phase controlling current substantially proportional to the consultation current, from the second reference potential to the capacitor.

3. The oscillating apparatus as set forth in claim 2, wherein the current stabilizing circuit further includes:
a phase controlling current changing circuit that changes a size of a phase controlling current by setting a ratio of the consultation current supplied to the phase controlling current supply with respect to the reference current to a designated value.

4. The oscillating apparatus as set forth in claim 1, wherein the charge pump current supply is connected to a first reference potential, and runs the charge pump current substantially proportional to a predetermined consultation current, to the first reference potential, and
the phase controlling current supply is connected to a second reference potential higher than the first reference potential, and runs the consultation current and the phase controlling current substantially proportional to the reference current, from the second reference potential to the charge pump current supply and the capacitor.

5. The oscillating apparatus as set forth in claim 1, wherein the charge pump current supply runs the charge pump current and a consultation current proportional to a size of the reference voltage, to the first reference potential, and
the phase controlling current supply is connected to a second reference potential higher than the first reference potential, and runs the phase controlling current substantially proportional to the consultation current, from the second reference potential to the capacitor.

6. The oscillating apparatus as set forth in claim 1, wherein the current stabilizing circuit further includes:
a current adjusting circuit that sets a response characteristic being a change amount of a frequency of the oscillation signal with respect to a fluctuation amount of the phase difference, by setting a ratio of the charge pump current with respect to the reference current to a designated value.

7. The oscillating apparatus as set forth in claim 6, wherein the current adjusting circuit, when changing the ratio of the charge pump current with respect to the reference current, changes the phase controlling current so as to maintain a ratio between the charge pump current and the phase controlling current as a ratio prior to the change.

8. The oscillating apparatus as set forth in claim 1, wherein the current stabilizing circuit further includes:
a current adjusting circuit that sets a response characteristic of changing a frequency of the oscillation signal in response to a fluctuation of the phase difference, by setting a current value of the reference current to a designated value.

9. The oscillating apparatus as set forth in claim 8, wherein when a time elapsed after the oscillating apparatus has started outputting the oscillation signal is shorter, the current adjusting circuit sets a response speed for changing the frequency in response to the fluctuation of the phase difference, to be faster than when the elapsed time is longer.

10. The oscillating apparatus as set forth in claim 1, wherein the charge pump current supply further sets a response characteristic being a change amount of a frequency of the oscillation signal with respect to a fluctuation amount of the phase difference, by setting a ratio of the charge pump current with respect to the reference voltage to a designated value.

11. An oscillating apparatus comprising:
a filter circuit that includes a capacitor and outputs a control signal based on an amount of charge accumulated in the capacitor;
an oscillator that outputs an oscillation signal of a frequency that is based on the control signal;
a phase comparator that compares the oscillation signal with a reference signal of a predetermined frequency, to detect a phase difference between the oscillation signal and the reference signal;
a switch circuit that controls whether to charge the capacitor according to a predetermined charge current or to discharge the capacitor according to a predetermined discharge current, based on the phase difference; and
a current stabilizing circuit that defines each of the charge current and the discharge current based on a predetermined reference current or a reference voltage, the current stabilizing circuit including:
a phase controlling current supply that is connected to the capacitor, sets a predetermined phase controlling current as a discharge current, and discharges the capacitor according to the discharge current; and
a charge pump current supply that, when being connected to the capacitor via the switch circuit, charges the capacitor by running a predetermined charge pump current,
wherein current values respectively of the phase controlling current and of the charge pump current are set to be substantially proportional to the reference current or the reference voltage.

12. The oscillating apparatus as set forth in claim 11, wherein
the charge pump current supply is connected to a first reference potential, and runs the charge pump current and a consultation current substantially proportional to the reference current, to the first reference potential, and
the phase controlling current supply is connected to a second reference potential higher than the first reference potential, and runs the phase controlling current substantially proportional to the consultation current, from the second reference potential to the capacitor.

13. The oscillating apparatus as set forth in claim 12, wherein the current stabilizing circuit further includes:
a phase controlling current changing circuit that changes a size of a phase controlling current by setting a ratio of the consultation current supplied to the phase controlling current supply with respect to the reference current to a designated value.

14. The oscillating apparatus as set forth in claim 11, wherein
the charge pump current supply is connected to a first reference potential, and runs the charge pump current substantially proportional to a predetermined consultation current, to the first reference potential, and
the phase controlling current supply is connected to a second reference potential higher than the first reference potential, and runs the consultation current and the phase controlling current substantially proportional to the reference current, from the second reference potential to the charge pump current supply and the capacitor.

15. The oscillating apparatus as set forth in claim 11, wherein the charge pump current supply runs the charge pump current and a consultation current proportional to a size of the reference voltage, to the first reference potential, and the phase controlling current supply is connected to a second reference potential higher than the first reference potential, and runs the phase controlling current substantially proportional to the consultation current, from the second reference potential to the capacitor.

16. The oscillating apparatus as set forth in claim 11, wherein the current stabilizing circuit further includes:

a current adjusting circuit that sets a response characteristic being a change amount of a frequency of the oscillation signal with respect to a fluctuation amount of the phase difference, by setting a ratio of the charge pump current with respect to the reference current to a designated value.

17. The oscillating apparatus as set forth in claim 16, wherein the current adjusting circuit, when changing the ratio of the charge pump current with respect to the reference current, changes the phase controlling current so as to maintain a ratio between the charge pump current and the phase controlling current as a ratio prior to the change.

18. The oscillating apparatus as set forth in claim 11, wherein the current stabilizing circuit further includes:

a current adjusting circuit that sets a response characteristic of changing a frequency of the oscillation signal in response to a fluctuation of the phase difference, by setting a current value of the reference current to a designated value.

19. The oscillating apparatus as set forth in claim 18, wherein when a time elapsed after the oscillating apparatus has started outputting the oscillation signal is shorter, the current adjusting circuit sets a response speed for changing the frequency in response to the fluctuation of the phase difference, to be faster than when the elapsed time is longer.

20. The oscillating apparatus as set forth in claim 11, wherein the charge pump current supply further sets a response characteristic being a change amount of a frequency of the oscillation signal with respect to a fluctuation amount of the phase difference, by setting a ratio of the charge pump current with respect to the reference voltage to a designated value.

* * * * *